(12) United States Patent
Yoo

(10) Patent No.: US 10,522,564 B2
(45) Date of Patent: Dec. 31, 2019

(54) FERROELECTRIC MEMORY DEVICE AND METHOD OF MANUFACTURING THE SAME

(71) Applicant: SK hynix Inc., Icheon (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/810,177

(22) Filed: Nov. 13, 2017

(65) Prior Publication Data

US 2018/0240803 A1     Aug. 23, 2018

(30) Foreign Application Priority Data

Feb. 23, 2017    (KR) .................. 10-2017-0024301

(51) Int. Cl.
| | | |
|---|---|---|
| *H01L 29/66* | (2006.01) | |
| *H01L 27/1159* | (2017.01) | |
| *H01L 29/423* | (2006.01) | |
| *H01L 29/51* | (2006.01) | |
| *H01L 21/02* | (2006.01) | |
| *H01L 29/78* | (2006.01) | |
| *H01L 21/28* | (2006.01) | |

(52) U.S. Cl.
CPC .... *H01L 27/1159* (2013.01); *H01L 21/02181* (2013.01); *H01L 21/02189* (2013.01); *H01L 21/02194* (2013.01); *H01L 29/40111* (2019.08); *H01L 29/42364* (2013.01); *H01L 29/513* (2013.01); *H01L 29/516* (2013.01); *H01L 29/517* (2013.01); *H01L 29/6684* (2013.01); *H01L 29/78391* (2014.09)

(58) Field of Classification Search
CPC .............. H01L 27/1159; H01L 29/517; H01L 21/28291; H01L 21/02189; H01L 29/516; H01L 21/02181; H01L 29/78391; H01L 29/513; H01L 29/6684; H01L 21/02194; H01L 29/42364
See application file for complete search history.

(56) References Cited

U.S. PATENT DOCUMENTS

| | | | |
|---|---|---|---|
| 6,236,076 B1 * | 5/2001 | Arita | .............. H01L 21/28291 257/213 |
| 2002/0130337 A1 | 9/2002 | Michida et al. | |
| 2015/0310905 A1 * | 10/2015 | Karda | ................... G11C 11/223 365/185.03 |
| 2016/0064655 A1 * | 3/2016 | Tao | ......................... H01L 45/04 257/4 |

* cited by examiner

*Primary Examiner* — David Vu

(57) ABSTRACT

In an embodiment, a ferroelectric memory device includes a substrate having a source region and a drain region, a ferroelectric structure disposed on the substrate, and a gate electrode layer disposed on the ferroelectric structure. The ferroelectric structure includes a ferroelectric material layer having a concentration gradient of a dopant.

11 Claims, 6 Drawing Sheets

FERROELECTRIC MEMORY DEVICE AND METHOD OF MANUFACTURING THE SAME

CROSS-REFERENCE TO RELATED APPLICATION

The present application claims priority under 35 U.S.C. 119(a) to Korean Patent Application No. 10-2017-0024301, filed on Feb. 23, 2017, which is herein incorporated by reference in its entirety.

BACKGROUND

1. Technical Field

Embodiments of the present disclosure relate to a ferroelectric memory device and a method of manufacturing the same.

2. Related Art

In general, a ferroelectric material is a material having spontaneous electrical polarization in the absence of an applied external electric field. More specifically, a ferroelectric material can maintain one of two stable remanent polarization states. Thus, a ferroelectric material may be utilized to store digital information in a nonvolatile manner. For example, binary information "0" or "1" may be stored in remanent polarization states.

Remanent polarization in a ferroelectric material can be reversibly switched by an external electric field. The application of ferroelectric materials in nonvolatile memory devices has been actively studied. As an example, perovskite materials, which can manifest ferroelectric properties or characteristics, such as lead zirconate titanate (PZT) or strontium bismuth tantalite (SBT) have been studied for applications in nonvolatile memory devices.

SUMMARY

A ferroelectric memory device according to an aspect of the present disclosure is disclosed. The ferroelectric memory device may include a substrate having a source region and a drain region, a ferroelectric structure disposed on the substrate, and a gate electrode layer disposed on the ferroelectric structure. The ferroelectric structure includes a ferroelectric material layer having a concentration gradient of a dopant, A method of manufacturing a ferroelectric memory device according to another aspect of the present disclosure is disclosed. In the method, a substrate may be provided. A ferroelectric structure including a ferroelectric material layer having a concentration gradient of a dopant may be formed on the substrate. A gate electrode layer may be formed on the ferroelectric structure.

DETAILED DESCRIPTION

Figure 1:
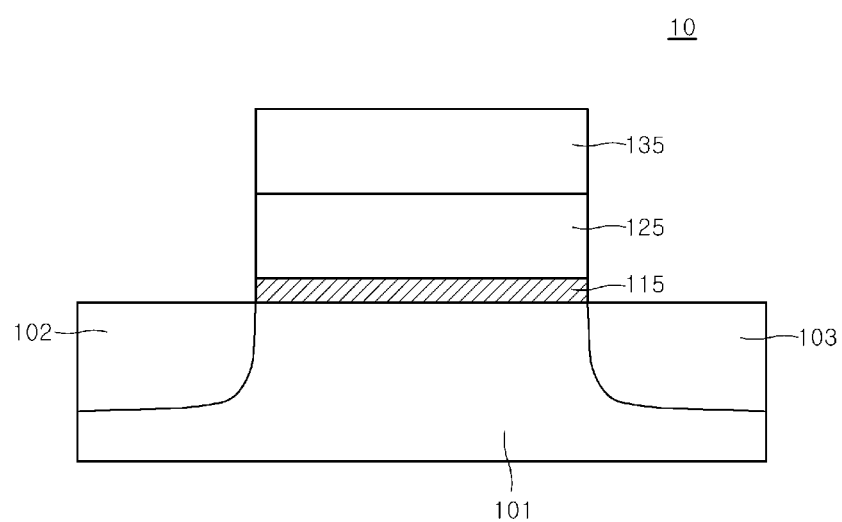
FIG. 1 is a schematic view illustrating a ferroelectric memory device having a ferroelectric structure according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have" or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

Techniques for developing or inducing ferroelectric properties in a thin film have been reported in recent research. As an example, it has been reported that, in a thin film fabricating process, when a stress is applied to a thin non-ferroelectric film, a lattice structure of the thin film is transformed, and the thin film develops ferroelectric properties. A hafnium oxide layer is an example of a thin film that, upon application of anisotropic stress, has a lattice structure that transforms from a tetragonal crystal system to an orthorhombic crystal system having ferroelectric properties. J. Müller, et al. (*Nano Lett.*, 2012, 12 (8), pp 4318-4323) have reported that in a solid solution of $Hf_xZr_yO_2$ (0<x, y<1) including hafnium oxide ($HfO_2$) and zirconium oxide ($ZrO_2$), when the content ratio of hafnium (Hf) and zirconium (Zr) constituting the hafnium oxide ($HfO_2$) and the zirconium oxide ($ZrO_2$) is controlled, the $Hf_xZr_yO_2$ solid solution can have a structure of four-crystal system that has ferroelectric properties. In addition, J. Müller, et al. (*Nano Lett.*, 2012, 12 (8), pp 4318-4323), also disclose that when an external electric field is applied to a pure zirconium oxide ($ZrO_2$) thin film, the thin film is transformed to have ferroelectric properties.

Other research in ferroelectric materials and antiferroelectric materials, including research into hafnium oxide thin films or zirconium oxide thin films, has reported that characteristics of ferroelectric properties or antiferroelectric properties vary depending on the concentration of an implanted dopant, the growth of the thin film, or the heat treatment of the thin film. As an example, U. Schroeder, et al. (*Japanese Journal of Applied Physics*, 2014, 53(8S1)) reported that the polarization hysteresis curve of a hafnium oxide layer varies depending on the concentration of a silicon oxide material dopant in the hafnium oxide layer. In another example, D. Zhou, et al. (*Applied Physics Letters*, 2013, 103(19), 2904) reported that the shape of the polarization hysteresis curve of a silicon-doped hafnium oxide thin film changes according to the number of cycles of an applied pulse voltage.

An embodiment of the present disclosure includes a ferroelectric structure including a ferroelectric material layer disposed on a substrate. The ferroelectric material layer includes a concentration gradient of a dopant. The dopant may generate a lattice strain in the ferroelectric material layer. Also, the dopant is distributed in a concentration gradient in the ferroelectric material layer, resulting in a gradient of lattice strain in the ferroelectric material layer. The gradient of lattice strain generates a flexoelectric effect, forming an internal electric field in the ferroelectric material layer. The flexoelectric effect may be a phenomenon in which an electric field is formed by a lattice strain gradient. A lattice strain gradient may be generated by lattice mismatch within a material layer, or by lattice mismatch at an interface between material layers that may be heterogeneous.

In an embodiment of the present disclosure, an internal electric field formed in a ferroelectric material layer can improve polarization alignment inside the ferroelectric material layer. In an embodiment of the present disclosure, the thickness of a ferroelectric material layer may be reduced or controlled to increase the gradient of the lattice strain causing a flexoelectric effect. For example, the ferroelectric material layer may have a thickness of about five nanometers (5 nm) to ten nanometers (10 nm).

An internal electric field resulting from flexoelectric effects may improve polarization orientation in one direction such that the ferroelectric properties of a ferroelectric structure may be stabilized. As an example, an internal electric field may suppress or prevent the ferroelectric state of the ferroelectric structure from being transformed into a paraelectric state or an antiferroelectric state. As another example, an internal electric field may align, in one direction, defective, randomly ordered dipoles in the ferroelectric material layer. The defective dipoles may be generated by defects existing in the ferroelectric material layer.

FIG. 1 is a schematic view illustrating a ferroelectric memory device 10 having a ferroelectric structure according to an embodiment of the present disclosure. Referring to FIG. 1, ferroelectric memory device 10 may include a substrate 101 having a source region 102 and a drain region 103. In addition, ferroelectric memory device 10 may include a ferroelectric structure 125 and a gate electrode layer 135, which are disposed over substrate 101. In a writing operation, the polarization state of ferroelectric structure 125 may be determined depending on the polarity or magnitude of a voltage applied to gate electrode layer 135. In a reading operation, the electrical resistance of the channel region in substrate 101 can be determined according to the polarization state of ferroelectric structure 125. Therefore, electrical information can be stored in a nonvolatile manner based on the polarization state of ferroelectric structure 125.

Referring to FIG. 1, substrate 101 may include a semiconductor material. Substrate 101 may, for example, be a silicon (Si) substrate, a gallium arsenide (GaAs) substrate, an indium phosphide (InP) substrate, a germanium (Ge) substrate, or a silicon germanium (SiGe) substrate, as non-limiting examples. Substrate 101 may be doped with an n-type or p-type dopant to have a determined conductivity.

Source region 102 and drain region 103 may be doped with n-type or p-type dopants. In an embodiment, when substrate 101 is n-type doped, source region 102 and drain region 103 may be p-type doped. In another embodiment, when substrate 101 is p-type doped, source region 102 and drain region 103 may be n-type doped.

An interfacial insulation layer 115 may be disposed between substrate 101 and ferroelectric structure 125. Interfacial insulation layer 115 may form stable interfaces with each of the substrate 101 and ferroelectric structure 125 such that Interfacial insulation layer 115 suppresses interfacial defects generated at an interface when substrate 101 directly contacts with ferroelectric structure 125. The interfacial defects may deteriorate an insulation property between the substrate 101 and ferroelectric structure 125. In addition, interfacial insulation layer 115 can suppress or prevent material diffusion between substrate 101 and ferroelectric structure 125. Interfacial insulation layer 115 may comprise silicon oxide, silicon nitride, or silicon oxynitride as non-limiting examples. Interfacial insulation layer 115 may have an amorphous state.

In an embodiment, ferroelectric structure 125 may have a ferroelectric material layer having a concentration gradient of dopant. Ferroelectric structure 125 may comprise a single layer structure or ferroelectric structure 125 may comprise a plurality of layers resulting in a multilayered structure. Each of the plurality of layers may be substantially the same in composition, or the plurality of layers may differ in composition. In another embodiment, ferroelectric structure 125 may comprise a hafnium oxide layer or a zirconium oxide layer, or both a hafnium oxide layer and a zirconium oxide layer. In some embodiments, ferroelectric structure 125 comprises a single ferroelectric material layer that may have a concentration gradient of dopant resulting in a lattice strain gradient through the layer and ferroelectric structure 125. In other embodiments, a plurality of ferroelectric material layers are doped to produce a lattice strain gradient through ferroelectric structure 125. In yet other embodiments, each of a plurality of ferroelectric material layers are doped to produce a lattice strain gradient through each respective layer, and therefore the lattice strain gradient may vary from layer to layer.

In an embodiment, ferroelectric structure 125 may have a thickness of about 5 nm to 10 nm. In an embodiment, the dopant in a ferroelectric material layer may be carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, by way of non-limiting examples.

In an embodiment, the concentration gradient of a dopant may be formed in one direction, along a thickness direction of the ferroelectric material layer. For example, the thickness direction may be a direction that is substantially perpendicular to a surface of substrate 101 or substantially perpendicular to a surface of interfacial insulation layer 115. Referring to FIG. 1, the thickness direction may be a direction that is parallel to the y-direction consistent with the X-Y axis illustrated in therein. In some embodiments, the concentration of the dopant may be distributed so as to continuously increase or continuously decrease along the thickness direction of ferroelectric structure 125.

Referring to FIG. 1, a gate electrode layer 135 may be disposed on ferroelectric material layer 125. Gate electrode layer 135 may, for example, include metal, conductive metal nitride, conductive metal oxide, or conductive metal carbide. Gate electrode layer 135 may include tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide, ruthenium oxide, or a combination of two or more thereof, as non-limiting examples.

As described above, ferroelectric memory device 10 may include ferroelectric structure 125 as a gate dielectric layer. Ferroelectric structure 125 may include a ferroelectric material layer having a concentration gradient of the dopant. The ferroelectric material layer may have a lattice strain gradient generated by the concentration gradient of the dopant. The lattice strain gradient may generate a flexoelectric effect, resulting in an internal electric field within the ferroelectric material layer. The internal electric field formed in the ferroelectric material layer can improve polarization alignment inside the ferroelectric material layer, thereby stabilizing the ferroelectric properties of the ferroelectric structure.

Figure 2:
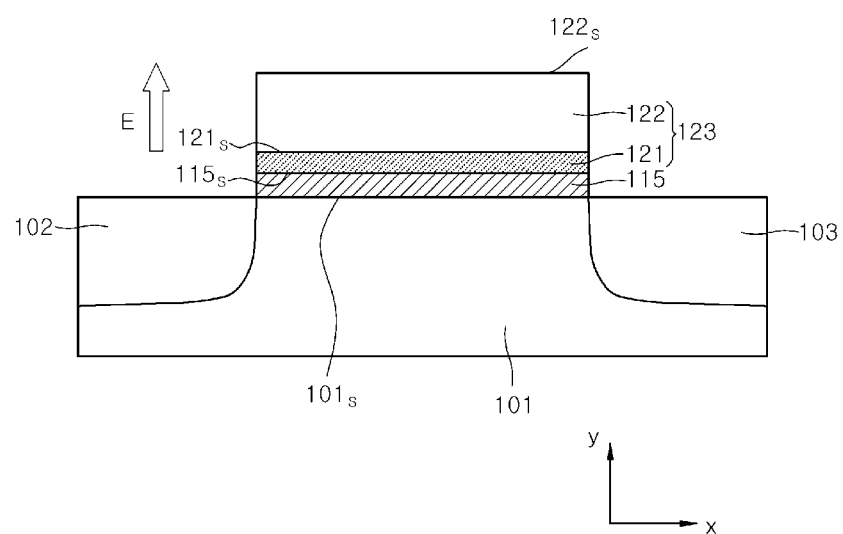
FIG. 2 is a schematic view illustrating another ferroelectric structure of a ferroelectric memory device according to an embodiment of the present disclosure.

FIG. 2 is a schematic view illustrating another ferroelectric structure 123 of the ferroelectric memory device 10 according to an embodiment of the present disclosure. Referring to FIG. 2, ferroelectric structure 123 may be disposed on an upper surface 115s of interfacial insulation layer 115. Although it is not shown in FIG. 2, gate electrode layer 135 of FIG. 1 may be disposed on the ferroelectric structure 123. Interfacial insulation layer 115 may be disposed on an upper surface 101s of substrate 101. In some embodiments, interfacial insulation layer 115 may be omitted, and ferroelectric structure 123 may be directly disposed on upper surface 101s of substrate 101.

In an embodiment, ferroelectric structure 123 may include a first layer 121 and a second layer 122. As an example, first layer 121 may be an undoped ferroelectric material layer and second layer 122 may be a ferroelectric material layer having a concentration gradient of a dopant. The concentration gradient of the dopant may be formed in one direction along a thickness direction of second layer 122. For instance, the thickness direction may be a direction that is substantially perpendicular to upper surface 101s of substrate 101 or substantially perpendicular to upper surface 115s of interfacial insulation layer 115. Also, the thickness direction may be a direction that is parallel to the y-direction consistent with the X-Y axis illustrated in FIG. 2. In an embodiment, the concentration of the dopant may be distributed to continuously increase or decrease along the thickness direction of second layer 122. The dopant may be carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, by way of non-limiting examples.

In another embodiment (not illustrated in FIG. 2), in ferroelectric structure 123, second layer 122 having a concentration gradient of dopant may be disposed on interfacial insulation layer 115, and an undoped first layer 121 may be disposed on second layer 122.

Examples of embodiments include, in ferroelectric structure 123, first layer 121 including an undoped ferroelectric hafnium oxide layer, and second layer 122 including a ferroelectric hafnium oxide layer doped with a dopant. In another example, first layer 121 may include an undoped ferroelectric zirconium oxide layer, and second layer 122 may include a ferroelectric zirconium oxide layer doped with a dopant. In yet another example, first layer 121 may include an undoped ferroelectric hafnium oxide layer and second layer 122 may include a ferroelectric zirconium oxide layer doped with a dopant. In a further example, first layer 121 may include an undoped ferroelectric zirconium oxide layer and second layer 122 may include a ferroelectric hafnium oxide layer doped with a dopant.

In an embodiment, a lattice strain due to lattice mismatch may occur at an interface between an undoped first layer 121 and a doped second layer 122. The dopant concentration gradient in second layer 122 may generate a lattice strain gradient in second layer 122. The flexoelectric effect generated by the lattice strain at interface 121s of first layer 121 and second layer 122, and by the lattice strain gradient in second layer 122, may form an internal electric field E in second layer 122. Although FIG. 2 illustrates an internal electric field E formed in a direction from interface 121s between first layer 121 and second layer 122 to a surface 122s of second layer, the direction of the internal electric field E may be reversed, depending on the concentration gradient direction of the dopant.

Internal electric field E may improve the polarization orientation inside second layer 122. As the polarization orientation is improved by internal electric field E, the ferroelectric properties of second layer 122 can be stabilized. For example, internal electric field E can suppress or prevent the ferroelectric properties of second layer 122 from being transformed into paraelectric properties or antiferroelectric properties. As another example, internal electric field E can align defective, randomly distributed dipoles in second layer 122 in a single direction. Accordingly, internal electric field E can improve the ferroelectric properties of second layer 122.

Referring to FIG. 2, in another embodiment, first layer 121 of ferroelectric structure 123 may be a first ferroelectric material layer doped with a first dopant, and second layer 122 may be a second ferroelectric material layer doped with a second dopant. The first and second dopants may, for example, include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof as non-limiting examples. At least one of the first and second ferroelectric material layers may have a concentration gradient of dopant.

In an embodiment, the first dopant and the second dopant may be different from each other. For example, first layer 121 may include a ferroelectric hafnium oxide layer doped with a first dopant, and second layer 122 may include a ferroelectric hafnium oxide layer doped with a second, different dopant. In another example, first layer 121 may include a ferroelectric zirconium oxide layer doped with a first dopant, and second layer 122 may include a ferroelectric zirconium oxide layer doped with a second, different dopant. In yet another example, first layer 121 may include a ferroelectric zirconium oxide layer doped with a first dopant, and second layer 122 may include a ferroelectric hafnium oxide layer doped with a second dopant.

In another embodiment, the first dopant and the second dopant may be the same. As an example, first layer 121 may include a zirconium oxide layer doped with a dopant, and second layer 122 may include a hafnium oxide layer doped with the same dopant.

In another embodiment, first layer 121 may be a ferroelectric $Hf_{0.5}Zr_{0.5}O_2$ layer and second layer 122 may be a ferroelectric material layer doped with a dopant. Second layer 122 may have a concentration gradient of the dopant. Second layer 122 may include a hafnium oxide ($HfO_2$) layer or a zirconium oxide ($ZrO_2$) layer. In some other embodiments (not illustrated in FIG. 2), second layer 122 having a dopant concentration gradient may be disposed on interfacial insulation layer 115 and a ferroelectric $Hf_{0.5}Zr_{0.5}O_2$ first layer 121 may be disposed on the second layer 122.

In an embodiment, the thickness of first layer 121 or second layer 122 can be reduced to a thickness level at which the lattice strain gradient of the layer can sufficiently generate a flexoelectric effect. For example, the thickness of a ferroelectric material layer may be substantially the same as the grain size of a ferroelectric material layer. Accordingly, a single grain of a ferroelectric material layer can form interfaces with other layers at both upper and lower surfaces of the ferroelectric material layer. In an embodiment, first layer 121 or second layer 122 may each have a thickness of about 5 nm to 10 nm. In another embodiment, ferroelectric structure 123 may have a total thickness of about 5 nm to 10 nm.

As described above, a lattice strain due to lattice mismatch may occur in the interface between first layer 121 and second layer 122. Inside the ferroelectric material layer having a concentration gradient of dopant, an internal electric field can be generated by the lattice strain gradient. The internal electric field can improve the polarization orientation in the ferroelectric material layer, thereby stabilizing the ferroelectric properties of the ferroelectric structure.

Figure 3:
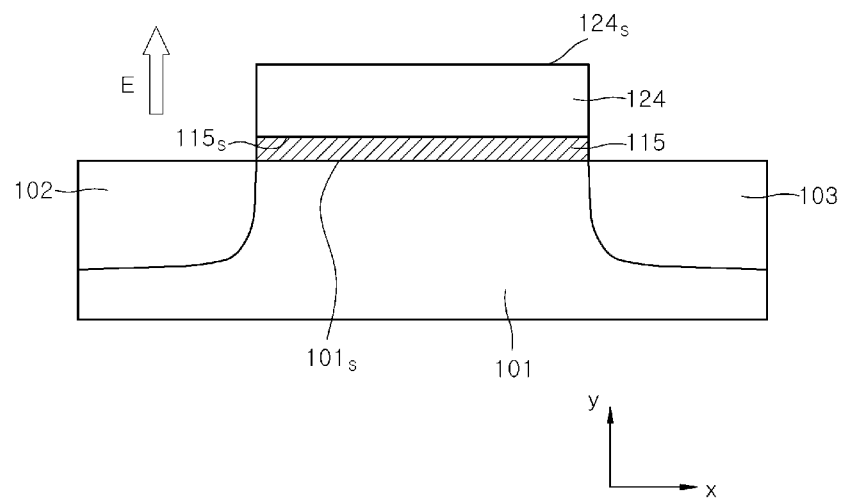
FIG. 3 is a schematic view illustrating another ferroelectric structure of a ferroelectric memory device according to an embodiment of the present disclosure.

FIG. 3 is a schematic view illustrating another ferroelectric structure 124 of ferroelectric memory device 10 according to an embodiment of the present disclosure. Referring to FIG. 3, ferroelectric structure 124 may be disposed on an upper surface 115s of interfacial insulation layer 115. Interfacial insulation layer 115 may be disposed on an upper surface 101s of substrate 101. Although it is not shown in FIG. 3, gate electrode layer 135 of FIG. 1 may be disposed on the ferroelectric structure 124. In some other embodiments, interfacial insulation layer 115 may be omitted, and ferroelectric structure 124 may be directly disposed on the upper surface 101s of substrate 101.

In an embodiment, ferroelectric structure 124 may include a single layer of ferroelectric material having a concentration gradient of dopant. The configuration of ferroelectric structure 124 is substantially the same as the configuration of second layer 122 described in embodiments above and with reference to FIG. 2. Therefore, a detailed description is omitted in order to limit duplication.

The dopant concentration gradient in ferroelectric structure 124 may cause a lattice strain gradient in ferroelectric structure 124. The flexoelectric effect generated by the lattice strain gradient may improve the polarization orientation in ferroelectric structure 124 by forming an internal electric field E in ferroelectric structure 124. By improving the polarization orientation along the internal electric field E, the ferroelectric properties of ferroelectric structure 124 may be stabilized.

Figure 4:
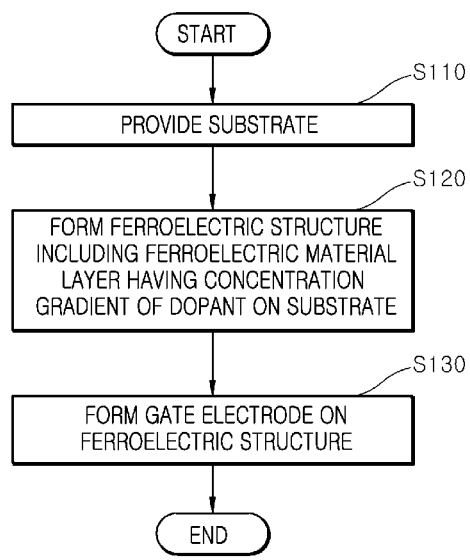
FIG. 4 is a flow chart schematically illustrating a method of manufacturing a ferroelectric memory device according to an embodiment of the present disclosure.

FIG. 4 is a flow chart schematically illustrating a method of manufacturing a ferroelectric memory device according to embodiments of the present disclosure. FIGS. 5 to 8 are schematic views illustrating a method of manufacturing a ferroelectric memory device according to an embodiment of the present disclosure.

Figure 5:
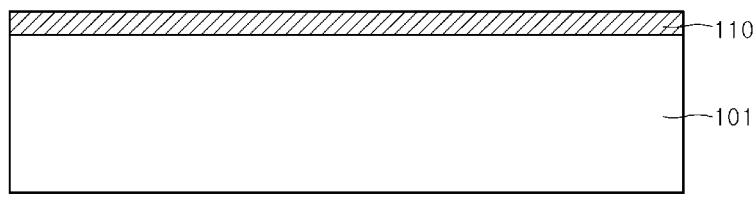
FIGS. 5 to 8 are schematic views illustrating a method of manufacturing a ferroelectric memory device according to an embodiment of the present disclosure.

Referring to operation S110 in FIG. 4 and FIG. 5, substrate 101 may be comprise a silicon (Si) substrate, a gallium arsenide (GaAs) substrate, an indium phosphide (InP) substrate, a germanium (Ge) substrate, or a silicon germanium (SiGe) substrate, by way of non-limiting examples. Substrate 101 may be doped with n-type or p-type dopant to have a determined conductivity.

Referring to FIG. 5, in an embodiment, interfacial insulation layer 110 may be formed on an upper portion of substrate 101. Interfacial insulation layer 110 may compensate for a difference in lattice constant between a ferroelectric structure 120 that will be formed on interfacial insulation layer 110 and substrate 101 to eliminate, reduce or control interfacial stress. For example, interfacial insulation layer 110 may have a lattice constant that is between the lattice constant of substrate 101 and the lattice constant of ferroelectric structure 120. In addition, interfacial insulation layer 110 can serve as a barrier to material diffusion between substrate 101 and ferroelectric structure 120.

Interfacial insulation layer 110 may include, as non-limiting examples, silicon oxide, silicon nitride, or silicon oxynitride. Interfacial insulation layer 110 may be formed by, for example, a chemical vapor deposition method, an atomic layer deposition method, a coating method or other methods known in the art.

Figure 6:
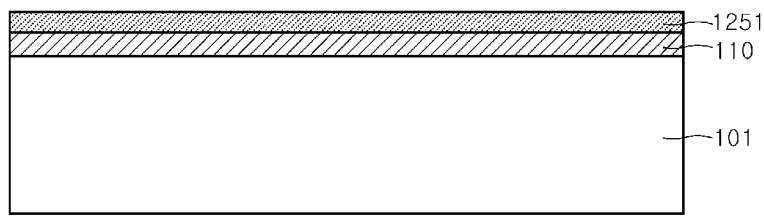
Figure 7:
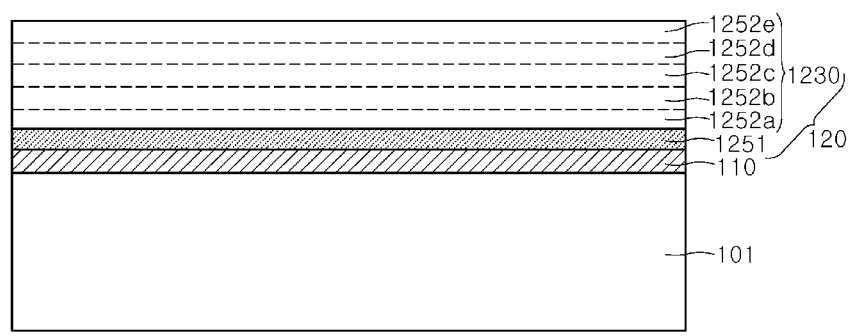

Referring to operation S120 in FIG. 4 and FIGS. 6 and 7, ferroelectric structure 120 including a ferroelectric material layer 1230 having a concentration gradient of a dopant may be formed on interfacial insulation layer 110. The dopant may include, as non-limiting examples, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La) or a combination of two or more thereof.

As illustrated in FIGS. 6 and 7, in an embodiment, ferroelectric structure 120 may include a first layer 1251 formed on interfacial insulation layer 110. First layer 1251 may be an undoped ferroelectric material layer. A second ferroelectric material layer 1230 may be formed on first layer 1251. Second ferroelectric material layer 1230 may include a plurality of unit layers 1252a, 1252b, 1252c, 1252d, and 1252e each having different concentrations with respect to a dopant. In an example, unit layers 1252a, 1252b, 1252c, 1252d, and 1252e may each comprise the same ferroelectric material layer composition and dopant, but each of the unit layers 1252a, 1252b, 1252c, 1252d, and 1252e may have different dopant concentrations within each respective unit layer. In another example, second ferroelectric material layer 1230 may be formed with a continuously increasing or a continuously decreasing concentration gradient with respect to a dopant by controlling the dopant concentrations in its unit layers. In another example, first layer 1251 and second ferroelectric material layer 1230 may comprise the same ferroelectric material layer composition.

As illustrated in FIG. 7, in an embodiment, five unit layers 1252a, 1252b, 1252c, 1252d, and 1252e are shown formed sequentially on first layer 1251, as an example. In other examples, the unit layers need not be formed in a sequence limited to that illustrated in FIG. 7. In yet other examples, ferroelectric material layer 1230 may comprise a single unit layer, or a plurality of unit layers.

In an example of an embodiment, first layer 1251 may be an undoped ferroelectric hafnium oxide layer and second ferroelectric material layer 1230 may comprise a ferroelectric hafnium oxide layer doped with a dopant. In another example, first layer 1251 may be an undoped ferroelectric zirconium oxide layer and second ferroelectric material layer 1230 may comprise a ferroelectric zirconium oxide layer doped with a dopant. In yet another example, first layer 1251 may be an undoped ferroelectric hafnium oxide layer and second ferroelectric material layer 1230 may comprise a ferroelectric zirconium oxide layer doped with a dopant. In a further example, first layer 1251 may be an undoped ferroelectric zirconium oxide layer and second ferroelectric material layer 1230 may comprise a ferroelectric hafnium oxide layer doped with a dopant.

First layer 1251 and second ferroelectric material layer 1230 may be formed, for example, by an atomic layer deposition method, a chemical vapor deposition method, a molecular beam deposition method, or an evaporation method. When forming a concentration gradient of a dopant in second ferroelectric material layer 1230, the amount of the dopant to be implanted in each unit layer can be controlled in the process of forming second ferroelectric material layer 1230. In an embodiment, second ferroelectric material layer 1230 may be formed such that the concentration of the dopant continuously increases or continuously decreases from unit layer 1252a, located at the lowermost portion of second ferroelectric material layer 1230 and formed on first layer 1251, through unit layer 1252e, located at the uppermost portion of second ferroelectric material layer 1230, on which a gate electrode layer may be formed.

In an embodiment, second ferroelectric material layer 1230 may, for example, have a thickness of about 5 nm to 10 nm. In some other embodiments, the thickness of ferroelectric structure 1230, including first layer 1251 and second ferroelectric material layer 1230, may be about 5 nm to 10 nm. In an embodiment, each of the plurality of unit layers 1252a, 1252b, 1252c, 1252d, and 1252e of second ferroelectric material layer 1230 may have substantially the same thickness. In a different embodiment, at least one of the plurality of the unit layers 1252a, 1252b, 1252c, 1252d, and 1252e may have a different thickness from that of the other unit layers.

In one embodiment, a hafnium oxide layer or a zirconium oxide layer may be deposited at a substrate temperature of about 150 degrees Celsius (° C.) to 350(° C.). The doping process for a hafnium oxide layer or a zirconium oxide layer may be performed by controlling the amount of a source gas including the dopant during the deposition of the hafnium oxide layer or the zirconium oxide layer. A hafnium oxide layer or a zirconium oxide layer may be formed in an amorphous state, a partially crystalline state, or a completely crystalline state.

In some embodiments, as illustrated in FIGS. 6 and 7, a first layer 1251 may formed on interfacial insulation layer 110 as a first ferroelectric material layer doped with a first dopant. A second layer 1230 may be formed on first layer 1251. Second layer 1230 may include a plurality of unit layers 1252a, 1252b, 1252c, 1252d, and 1252e each having different concentrations with respect a second dopant.

In one example, the first dopant and the second dopant may be substantially the same. As an example, first layer 1251 and second layer 1230 may be a zirconium oxide layer and a hafnium oxide layer, respectively, and each layer may be doped with substantially the same dopant.

In another example, the first dopant and the second dopant may be different from each other. For instance, first layer 1251 may be a ferroelectric hafnium oxide layer doped with a first dopant, and second layer 1230 may be a ferroelectric hafnium oxide layer doped with a second dopant. As another example, first layer 1251 may be a ferroelectric zirconium oxide layer doped with a first dopant and second layer 1230 may be a ferroelectric oxide layer doped with a second dopant. In yet another example, first layer 1251 may be a ferroelectric zirconium oxide layer doped with a first dopant and second layer 1230 may be a ferroelectric hafnium oxide layer doped with a second dopant.

In a further embodiment, at least one of a first ferroelectric material layer 1251 and a second ferroelectric material layer 1230 has a concentration gradient of dopant. When forming the concentration of the dopant in first layer 1251 and second layer 1230, the amount of the dopant to be implanted into each layer, and into each unit layer, can be controlled in the process of forming the layer or unit layer. For example, the doping process for each layer or unit layer may be performed by controlling the amount of a source gas including the dopant during deposition. The thickness of first layer 1251 or second layer 1230 having a concentration gradient of the dopant may be about 5 nm to 10 nm. In some other embodiments, the thickness of ferroelectric structure 120, including first layer 1251 and second layer 1230, may be about 5 nm to 10 nm.

In some embodiments, as illustrated in FIGS. 6 and 7, first layer 1251 may be a ferroelectric $Hf_{0.5}Zr_{0.5}O_2$ layer and second layer 1230 may be a ferroelectric material layer doped with a dopant. Second ferroelectric material layer 1230 may have a concentration gradient of the dopant. Second ferroelectric material layer 1230 may include a hafnium oxide layer or a zirconium oxide layer.

In other embodiments not illustrated herein, second layer 1230 having a concentration gradient of a dopant may be disposed on interfacial insulation layer 110 and a ferroelectric $Hf_{0.5}Zr_{0.5}O_2$ layer may be disposed on second layer 1230.

Figure 8:
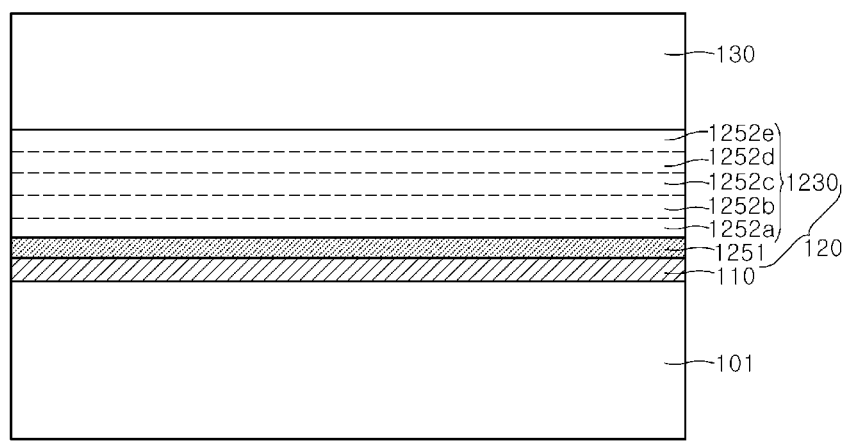

Referring to operation S130 in FIG. 4 and FIG. 8, in an embodiment, a gate electrode layer 130 may be formed on ferroelectric structure 120. Gate electrode layer 130 may include tungsten (W), titanium (Ti), copper (Cu), aluminum (Al), ruthenium (Ru), tungsten nitride, titanium nitride, tantalum nitride, tungsten carbide, titanium carbide, tungsten silicide, titanium silicide, tantalum silicide, or a combination of two or more thereof, by way of non-limiting examples. Gate electrode layer 130 may, for example, be formed using a sputtering method, a chemical vapor deposition method, an evaporation method, or an atomic layer deposition method.

Although not illustrated herein, in an embodiment, when first layer 1251 or second layer 1230 is formed in an amorphous state, a crystallization heat treatment may be additionally performed with respect to first layer 1251 or second layer 1230. The crystallization heat treatment may be performed at a process temperature of about 400° C. to 600° C.

In one example, the crystallization heat treatment may be performed after gate electrode layer 130 is formed. In another embodiment, the crystallization heat treatment may be performed during the process of forming gate electrode layer 130. That is, when the process of forming gate electrode layer 130 is performed at a process temperature of about 400° C. to 600° C., first layer 1251 or second layer 1230 can be crystallized in the process of forming the gate electrode layer 130. In such a case, a separate crystallization heat treatment may be omitted.

Although not illustrated, gate electrode layer 130, second layer 1230, first layer 1251 and interfacial insulation layer 110 may be patterned on substrate 101 to form a gate structure. Although it is not illustrated, a source region and a drain region may be formed in substrate 101 at both ends of the gate structure. The source region and the drain region may be formed by selectively implanting a dopant of a doping type opposite to the doping type of substrate 101 into substrate 101. The source region and the drain region may be formed in an upper region of substrate 101 in the form of a well through known ion implantation method, for example.

As a result, a ferroelectric memory device having a gate structure, a channel region formed in the substrate under the gate structure, and source and drain regions formed in the substrate at both ends of the gate structure can be manufactured.

Figure 9:
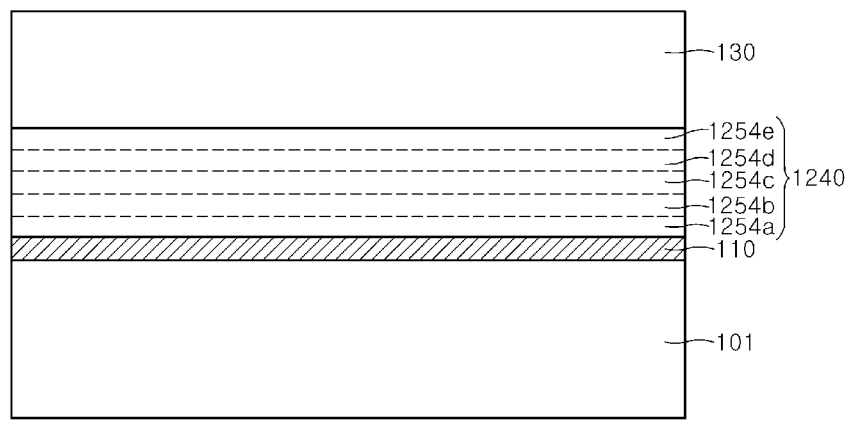
FIG. 9 is a schematic view illustrating a method of manufacturing a ferroelectric memory device according to another embodiment of the present disclosure.

FIG. 9 is a schematic view illustrating a method of manufacturing a ferroelectric memory device according to another embodiment of the present disclosure. Referring to FIG. 9, the method of manufacturing a ferroelectric memory device may include a method of forming a ferroelectric material layer 1240, on which gate electrode layer 130 is formed.

More specifically, when ferroelectric material layer 1240 is formed, a plurality of unit layers 1254a, 1254b, 1254c, 1254d, and 1254e having a concentration gradient of a dopant are formed on an interfacial insulation layer 110. In an embodiment, unit layers 1254a, 1254b, 1254c, 1254d, and 1254e may each include the same ferroelectric material and the same dopant, but unit layers 1254a, 12544b, 1254c, 1254d, and 1254e have different dopant concentrations, or distributions, within each respective unit layer. The method of forming the plurality of unit layers 1254a, 1254b, 1254c, 1254d, and 1254e may be substantially the same as the method of forming the unit layers 1252a, 1252b, 1252c, 1252d, and 1252e of second layer 1230 of an embodiment described above and with reference to FIGS. 5 to 8. Therefore, a detailed description is omitted in order to limit duplication.

According to embodiments of the present disclosure, a ferroelectric structure including a ferroelectric material layer having a concentration gradient of the dopant on a substrate can be provided. The dopant can generate a lattice strain in the ferroelectric material layer. The dopant can also be distributed to have a concentration gradient so that the lattice strain can generate a gradient in the ferroelectric material layer. The gradient of the lattice strain may generate a flexoelectric effect, forming an internal electric field in the ferroelectric material layer. The internal electric field can stabilize the ferroelectric properties in the ferroelectric structure by improving the polarization orientation of the ferroelectric material layer.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
a substrate having a source region and a drain region;
a ferroelectric structure disposed on the substrate,
wherein the ferroelectric structure comprises
a first ferroelectric material layer doped with a first dopant disposed on the substrate;
a second ferroelectric material layer doped with a second dopant disposed directly on the first ferroelectric material layer; and
a gate electrode layer disposed on the ferroelectric structure,
wherein the first dopant and the second dopant are different from each other,
wherein the first ferroelectric material and the second ferroelectric material are different from each other, and
wherein at least one of the first and second ferroelectric material layers has a concentration gradient of the corresponding first dopant or second dopant.

2. The ferroelectric memory device of claim 1,
wherein the concentration gradient of the first dopant is formed in a thickness direction of the first ferroelectric material layer.

3. The ferroelectric memory device of claim 2, wherein the concentration gradient of the first dopant is distributed to continuously increase or continuously decrease along the thickness direction of the first ferroelectric material layer.

4. The ferroelectric memory device of claim 1,
wherein a thickness of the first ferroelectric material layer is substantially the same as a grain size of the ferroelectric material layer.

5. The ferroelectric memory device of claim 1,
wherein the ferroelectric structure has a thickness of 5 nm.

6. The ferroelectric memory device of claim 1,
wherein the first ferroelectric material layer comprises a hafnium oxide layer or a zirconium oxide layer.

7. The ferroelectric memory device of claim 6,
wherein the first dopant comprises at least one selected from carbon (C), silicon (Si), nitrogen (N), and germanium (Ge).

8. The ferroelectric memory device of claim 1,
wherein the ferroelectric structure further comprises a plurality of ferroelectric material layers;
wherein each of the plurality of ferroelectric material layers includes a dopant;
wherein each of the first ferroelectric material layer and the plurality of ferroelectric material layers is doped to produce a lattice strain gradient through each respective layer; and
wherein the lattice strain gradient varies from layer to layer.

9. The ferroelectric memory device of claim 1,
wherein the first dopant comprises at least one selected from carbon (C), silicon (Si), nitrogen (N), and germanium (Ge), and
wherein the second dopant comprises at least one selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

10. A method of manufacturing a ferroelectric memory device, the method comprising:
providing a substrate;
forming a ferroelectric structure including a first ferroelectric material layer doped with a first dopant disposed on the substrate and a second ferroelectric material layer doped with a second dopant disposed directly on the first ferroelectric material layer; and
forming a gate electrode layer on the ferroelectric structure
wherein the first dopant and the second dopant are different from each other,
wherein the first ferroelectric material and the second ferroelectric material are different from each other, and
wherein at least one of the first and second ferroelectric material layers have a concentration gradient of at least one of corresponding the first and the second dopants.

11. The method of claim 10,
wherein forming the ferroelectric structure comprises forming the ferroelectric material layer using a deposition process of an atomic layer deposition method, a chemical vapor deposition method, a molecular beam deposition method, or an evaporation method, and wherein the amount of the dopant in the ferroelectric material layer is controlled in the deposition process.

* * * * *